United States Patent [19]
den Boer et al.

[11] Patent Number: 6,124,606
[45] Date of Patent: Sep. 26, 2000

[54] METHOD OF MAKING A LARGE AREA IMAGER WITH IMPROVED SIGNAL-TO-NOISE RATIO

[75] Inventors: Willem den Boer, Plymouth; John Z. Z. Zhong, Novi; Tieer Gu, West Bloomfield; Young H. Byun, Novi; Steven Aggas, Pinckney, all of Mich.

[73] Assignee: OIS Optical Imaging Systems, Inc., Northville, Mich.

[21] Appl. No.: 09/007,177

[22] Filed: Jan. 14, 1998

Related U.S. Application Data

[63] Continuation-in-part of application No. 08/630,984, Apr. 12, 1996, which is a continuation-in-part of application No. 08/470,271, Jun. 6, 1995, abandoned.

[51] Int. Cl.[7] .................................................. H01L 27/146
[52] U.S. Cl. .......................... 257/291; 257/386; 257/444
[58] Field of Search .................................... 257/292, 258, 257/291, 386, 389, 444; 438/780

[56] References Cited

U.S. PATENT DOCUMENTS

| | | |
|---|---|---|
| 4,672,454 | 6/1987 | Cannella et al. . |
| 4,728,802 | 3/1988 | Baron . |
| 4,731,610 | 3/1988 | Baron et al. . |
| 4,868,616 | 9/1989 | Johnson et al. . |
| 5,003,356 | 3/1991 | Wakai et al. . |
| 5,396,072 | 3/1995 | Schiebel et al. . |
| 5,498,880 | 3/1996 | Lee et al. . |
| 5,641,974 | 6/1997 | den Boer et al. . |
| 5,770,871 | 6/1998 | Weisfield . |
| 5,780,871 | 7/1998 | Den Boer et al. . |
| 5,920,084 | 7/1999 | Gu et al. . |
| 6,011,274 | 1/2000 | Gu et al. . |

*Primary Examiner*—George Fourson
*Attorney, Agent, or Firm*—Laff, Whitesel & Saret, Ltd.

[57] ABSTRACT

This invention is related to a radiation imager (e.g. x-ray imager) and method of making same. An insulating material having a low dielectric constant is provided in areas of overlap between collector electrodes and underlying TFTs, diodes, and/or address lines in order to improve the signal-to-noise ratio of the imager. The TFT array and corresponding imager are made in certain embodiments by coating the address lines and TFTs with a photo-imageable insulating layer which acts as a negative resist, exposing portions of the insulating layer with UV light, removing non-exposed areas of the insulating layer so as to form contact vias, and depositing storage capacitor collecting electrodes over the insulating layer so that the collecting electrodes contact TFT source electrodes through the contact vias. The resulting imager has an improved signal-to-noise ratio due to the low dielectric constant of the insulating layer.

7 Claims, 6 Drawing Sheets

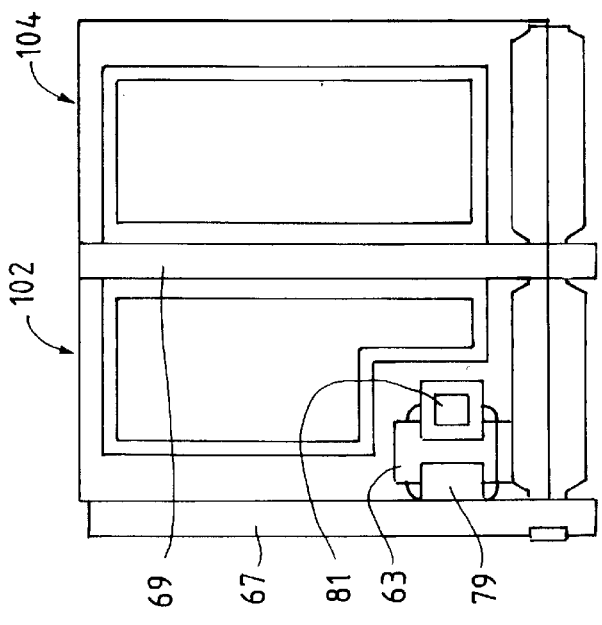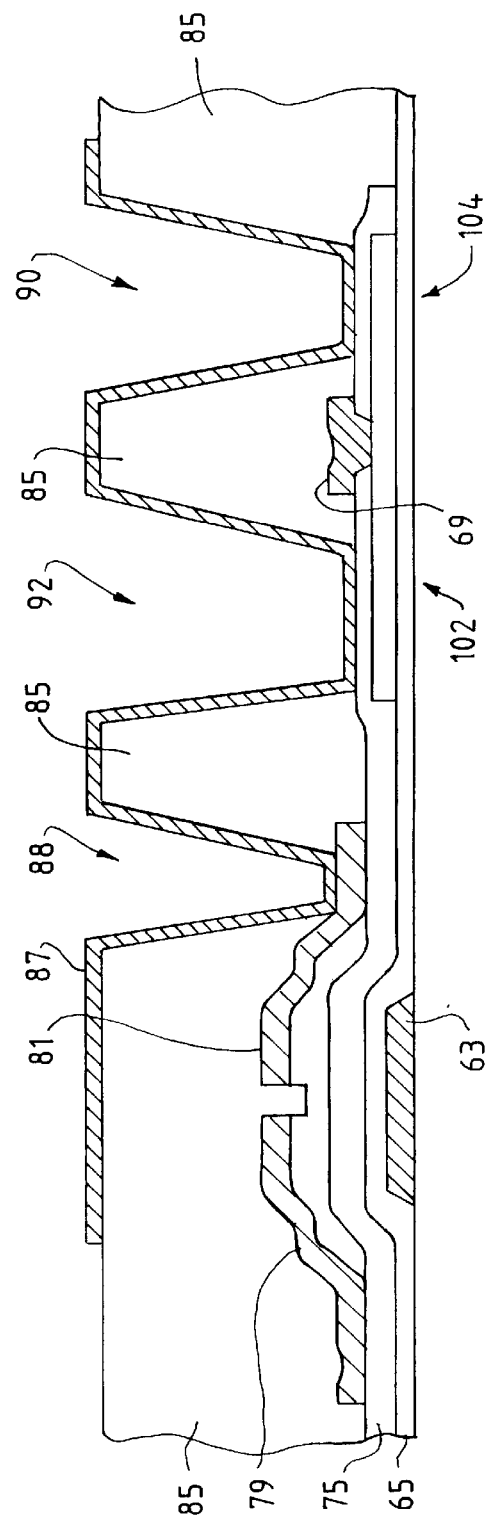

METHOD OF MAKING A LARGE AREA IMAGER WITH IMPROVED SIGNAL-TO-NOISE RATIO

This application is a continuation-in-part (CIP) of U.S. Ser. No. 08/630,984, filed Apr. 12, 1996, which is a CIP of No. 08/470,271, filed Jun. 6, 1995, abandoned the disclosures of which are hereby incorporated herein by reference. This application is also related to U.S. Pat. No. 5,641,974 and Ser. No. 08/832,345, the disclosures of which are incorporated herein by reference.

This invention relates to a method of making an image sensor having an increased aperture ratio and/or improved signal-to-noise ratio. More particularly, this invention relates to a method of making an imager (e.g. x-ray imager) including an array of TFTs wherein a photo-imageable insulating layer having a plurality of contact vias or apertures disposed therein and a low dielectric constant is located in overlap areas between address lines and overlapping collector electrodes so as to reduce capacitive cross-talk. Also, the signal-to-noise (S/N) ratio is improved in view of the low dielectric constant of the insulating layer.

BACKGROUND OF THE INVENTION

Electronic matrix arrays find considerable application in X-ray image sensors. Such devices generally include X and Y (or row and column) address lines which are horizontally and vertically spaced apart and cross at an angle to one another thereby forming a plurality of crossover points. Associated with each crossover point is an element (e.g. pixel) to be selectively addressed. These elements in many instances are memory cells or pixels of an electronically adjustable memory array or X-ray imaging array.

Typically, at least one switching or isolation device such as a diode or thin film transistor (TFT) is associated with each array element or pixel. The isolation devices permit the individual pixels to be selectively addressed by the application of suitable potentials between respective pairs of the X and Y address lines. Thus, the TFTs and diodes act as switching elements for energizing or otherwise addressing corresponding memory cells or storage capacitors.

Amorphous silicon (a-Si) TFTs have found wide usage for isolation devices. Structurally, TFTs generally include substantially co-planar source and drain electrodes, a thin film semiconductor material (e.g. a-Si) disposed between the source and drain electrodes, and a gate electrode in proximity to the semiconductor but electrically insulated therefrom by a gate insulator. Current flow through the TFT between the source and drain is controlled by the application of voltage to the gate electrode. The voltage to the gate electrode produces an electric field which accumulates a charged region near the semiconductor-gate insulator interface. This charged region forms a current conducting channel in the semiconductor through which current is conducted. Thus, by controlling the voltage to the gate and drain/source electrodes, the pixels may be selectively addressed in a known manner. Herein, the TFT electrode which is connected to the pixel electrode or collector electrode is known as the "source."

Imagers are known in the art. For example, see U.S. Pat. Nos. 5,498,880; 5,396,072; and 5,619,033, the disclosures of which are hereby incorporated herein by reference. See also prior art FIGS. 1–3 herein.

Referring to prior art FIG. 1, a known image detector for capturing digital radiographic images is illustrated. The imager includes a plurality of pixels 3 each including a storage capacitor 7 and a switching thin film transistor (TFT) 5. The storage capacitor 7 in each pixel includes a collector electrode 4 which functions as a top plate of the storage capacitor, and a bottom plate 11 of the capacitor. A dielectric material such as silicon dioxide or silicon nitride is positioned between the top and bottom plates of each storage capacitor 7 in order to form the resulting capacitors 7. Prior art FIG. 2 is a side cross sectional view of a pair of imaging pixels 3 in the FIG. 1 imager. As shown in FIG. 2, each pixel 3 includes a switching TFT including gate electrode 13, source electrode 15, and drain electrode 17. A passivation layer 19 covers each TFT. In addition to a TFT, each pixel includes a storage capacitor including a collector electrode 4, bottom electrode 11, and a dielectric layer 21 located between the top and bottom electrodes. The imager further includes photoconductive layer 23, dielectric layer 25, and top conductive layer 27. Photoconductive layer 23 may include amorphous selenium, lead oxide, thallium bromide, mercuric iodide, or any other such material which exhibits photoconductivity so that upon exposure to x-ray radiation (or some other type of radiation) the photoconductive material exhibits reduced resistivity relative to that in the absence of such exposure. The reduced resistivity results from electron hole pairs generated in the material by the incident radiation. The charges moving across photoconductive layer 23 are typically proportional to the intensity of the incident radiation. The imager also includes charge detectors 29 (see FIG. 1), each of which produces a voltage output proportional to the charge detected on the respective Y address line. A more detailed description of the FIG. 1–2 imager structure is provided in U.S. Pat. No. 5,498,880, the disclosure of which is incorporated herein by reference.

Unfortunately, the material typically used as passivation layer 19 causes prior art imagers to be susceptible to cross-talk and undesirably large signal-to-noise ratios. The high dielectric constant value (above 6.0 for silicon nitride for example) of such materials causes large parasitic capacitances in areas where the collector electrode overlaps the TFT or address line(s). This large parasitic capacitance reduces the signal-to-noise ratio of the imager, as the parasitic capacitance between the ground line and the signal-line is a significant contributor to noise in the imager.

U.S. Pat. No. 5,619,033 discloses a solid state photodiode sensor array. Prior art FIG. 3, taken from the No. '033 patent, discloses on substrate 40 an imaging pixel 39 including switching TFT 41 having gate electrode 43, drain electrode 45, source electrode 47, gate insulator 49, a-Si:H semiconductor layer 51, n+ layer 53, metal TiW layer 55, and etch stop layer 57. The pixel further includes a sensing photodiode including p+ doped layer 59, undoped layer 61, and n+ doped layer 63. Layer 63 contacts the source electrode of the TFT through via or contact hole 65 formed in layer 69. The imager further includes conductive layer 71, passivation layer 73, SiON layer 75, bias contact 77 which contacts conductor 71 throuch contact hole 79, and notch 81 for separating the illustrated photodiode from adjacent photodiodes. During operation, the TFT is turned off to allow the photoidode to accumulate charge based on incident light. This accumulated charge is a received image signal. When a control signal is received form an external controller, the TFT turns on and transfers the accumulated charge in the photodiode to amplification and processing circuitry.

Unfortunately, as with the imager of FIGS. 1–2 discussed above, layer 69 in the FIG. 3 imager is undesirable in that its high dielectric constant value causes the imager to have an undesirably high signal to noise ratio as a result of the resulting parasitic capacitance in areas where the photodiode overlaps the TFT and/or address line(s).

Still further, layer 69 in the FIG. 3 prior art (and layer 19 in the FIG. 2 prior art) is non-photo-imageable. This is undesirable because, unforturnately, the method of making this imager (i) requires chemical vapor deposition (CVD) to deposit the silicon nitride layer 69(19), and (ii) silicon nitride is not photo-imageable (contact holes must be formed in such insulating layers by way of etching). As a result of these additional problems, the manufacturing process is both expensive and requires more steps than would otherwise be desirable. For example, in order to etch the contact holes in layers 19 and 69, an additional photoresist coating step is needed and the user must be concerned about layers underneath layers 19 and 69 during etching. Also, CVD requires expensive equipment.

It is apparent from the above that there exists a need in the art for an improved method for manufacturing a large area radiation imager with little capacitive cross-talk and improved signal-to-noise ratio. The method of manufacture, which is improved relative to the prior art, should include forming a photo-imageable insulating layer between collector electrodes and overlapped bus lines and/or TFTs, and the vias therein, by way of photo-imaging as opposed to wet or dry etching. The method should be simpler, cheaper, and more efficient to carry out. Still further, the improved method should utilize an insulation material having a low dielectric constant value in areas where the collector electrodes overlap switching devices (e.g. TFTs) and/or address lines so as to improve the signal-to-noise ratio of the imager.

It is a purpose of this invention to fulfill the above-described needs in the art, as well as other needs which will become apparent to the skilled artisan from the following detailed description of this invention.

SUMMARY OF THE INVENTION

An object of this invention is to provide a low dielectric constant insulation layer over switching devices (TFTs or diodes) in areas where imager receiving electrodes overlap the switching devices and/or address lines in order to reduce parasitic capacitance in such areas. Reduction in parasitic capacitance improves the signal-to-noise ratio of the imager. In the case of medical x-ray imaging, an increase in the signal-to-noise ratio (resulting in accordance with this invention) allows the same information to be obtained at a lower dose to the patient or more information at the same does.

Generally speaking, this invention fulfills the above-described needs in the art by providing a method of making a radiation imager including an array of a-Si semiconductor based thin film transistors (TFTs), the method comprising the steps of:

providing a first substantially transparent substrate;

forming an array of TFTs and corresponding address lines on the first substrate;

depositing an organic photo-imageable insulating layer over the TFT array and corresponding address lines;

photo-imaging the insulating layer in order to form a first array of vias or contact holes therein;

forming an array of collector electrode members on the first substrate over the photo-imaged insulating layer so that the electrode members in the array are in communication with the TFTs through the first array of vias or contact holes; and providing a photoconductor layer over the TFTs and collector electrodes so that storage capacitors formed in part by the collector electrodes store charge in amounts that are functions of incident radiation received by the imager.

In certain preferred embodiments, the method includes the step of overlapping the address lines with the collector electrodes so that the photo-imaged insulating layer is disposed therebetween so as to reduce cross-talk and enlarge the collector electrode surface area of the imager.

In still further preferred embodiments, the method comprises the step of forming the insulating layer so as to include one of photo-imageable Benzocyclobutene (BCB) and 2-Ethoxyethyl acetate.

This invention further fulfills the above-described needs in the art by providing a method of making an x-ray imager including an array of semiconductor switching elements, the method comprising the steps of:

a) providing a first substrate;

b) providing an array of semiconductor based switching elements (e.g. TFTs or diodes) and corresponding address lines on the first substrate;

c) spin coating an organic photo-imageable insulating layer having a dielectric constant of less than about 5.0 on the first substrate over the switching elements and address lines;

d) photo-imaging the insulating layer in order to form a first group of vias or contact holes therein, each via in the first group corresponding to one of the switching elements; and e) forming an array of electrodes over the photo-imaged insulating layer so that each electrode communicates with one of the switching elements through one of the vias in the insulating layer.

In preferred embodiments, the insulating layer has a dielectric constant value of less than about 3.5, and most preferably less than about 3.0.

This invention also fulfills the above referenced needs by providing an imager including an interlevel dielectric layer with a low dielectric constant value and/or photoimageability in order to improve S/N ratio and/or reduce manufacturing steps.

This invention will now be described with reference to certain embodiments thereof as illustrated in the following drawings.

IN THE DRAWINGS

FIG. 6 is a top view of an imager pixel similar to the FIG. 4 embodiment of this invention.

FIG. 7 is a side cross sectional view of the pixel of FIG. 6.

DETAILED DESCRIPTION OF CERTAIN EMBODIMENTS OF THIS INVENTION

Figure 1:
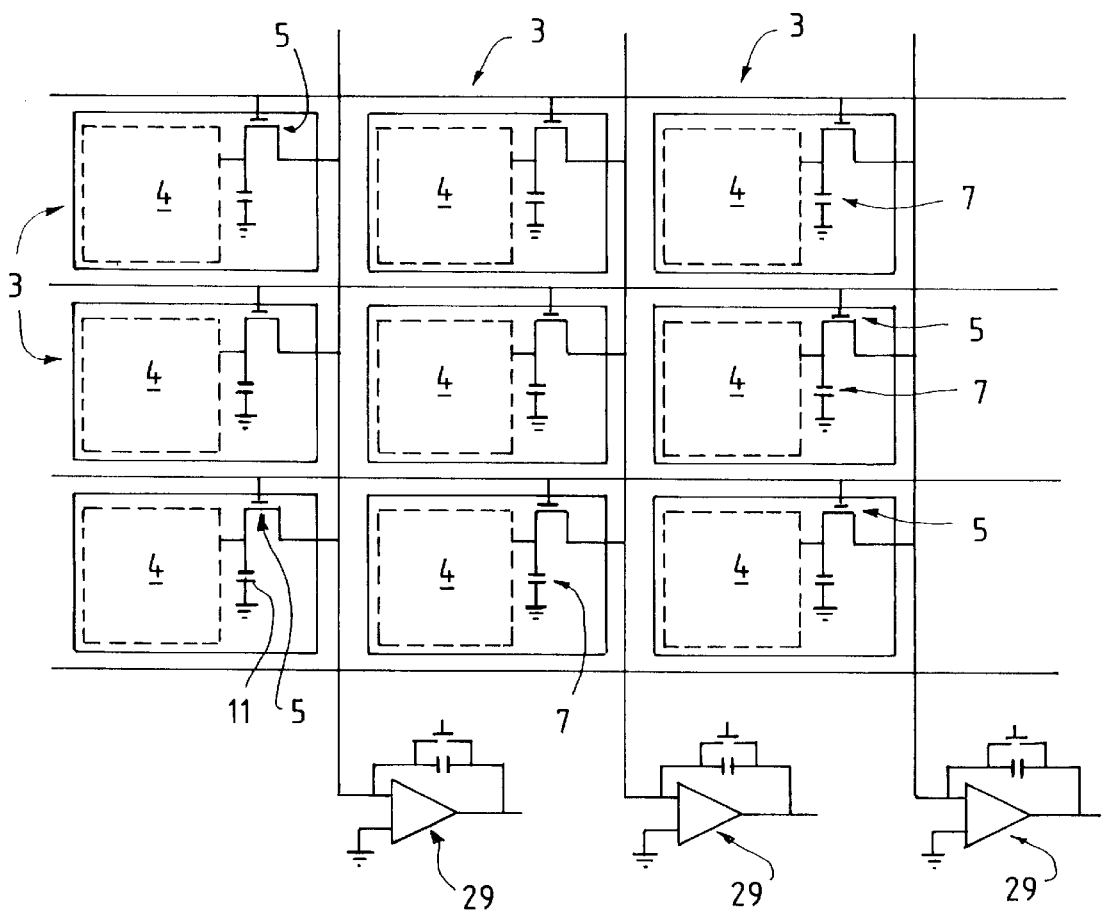
FIG. 1 is a schematic of a prior art imager array where in each pixel includes a switching TFT and a storage capacitor.
Figure 2:
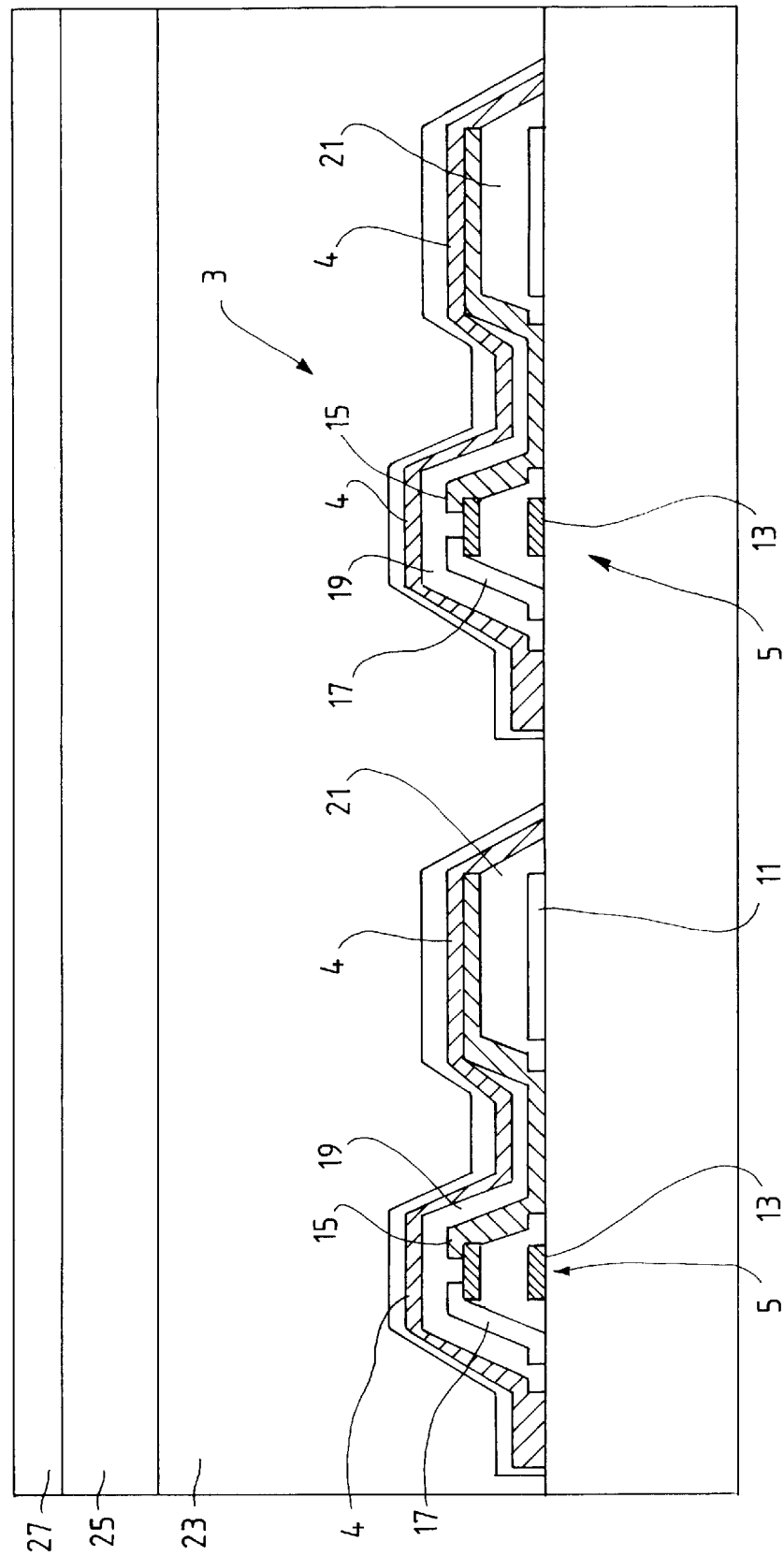
FIG. 2 is a side cross-sectional view of a pair of imager pixels from the FIG. 1 imager array.
Figure 3:
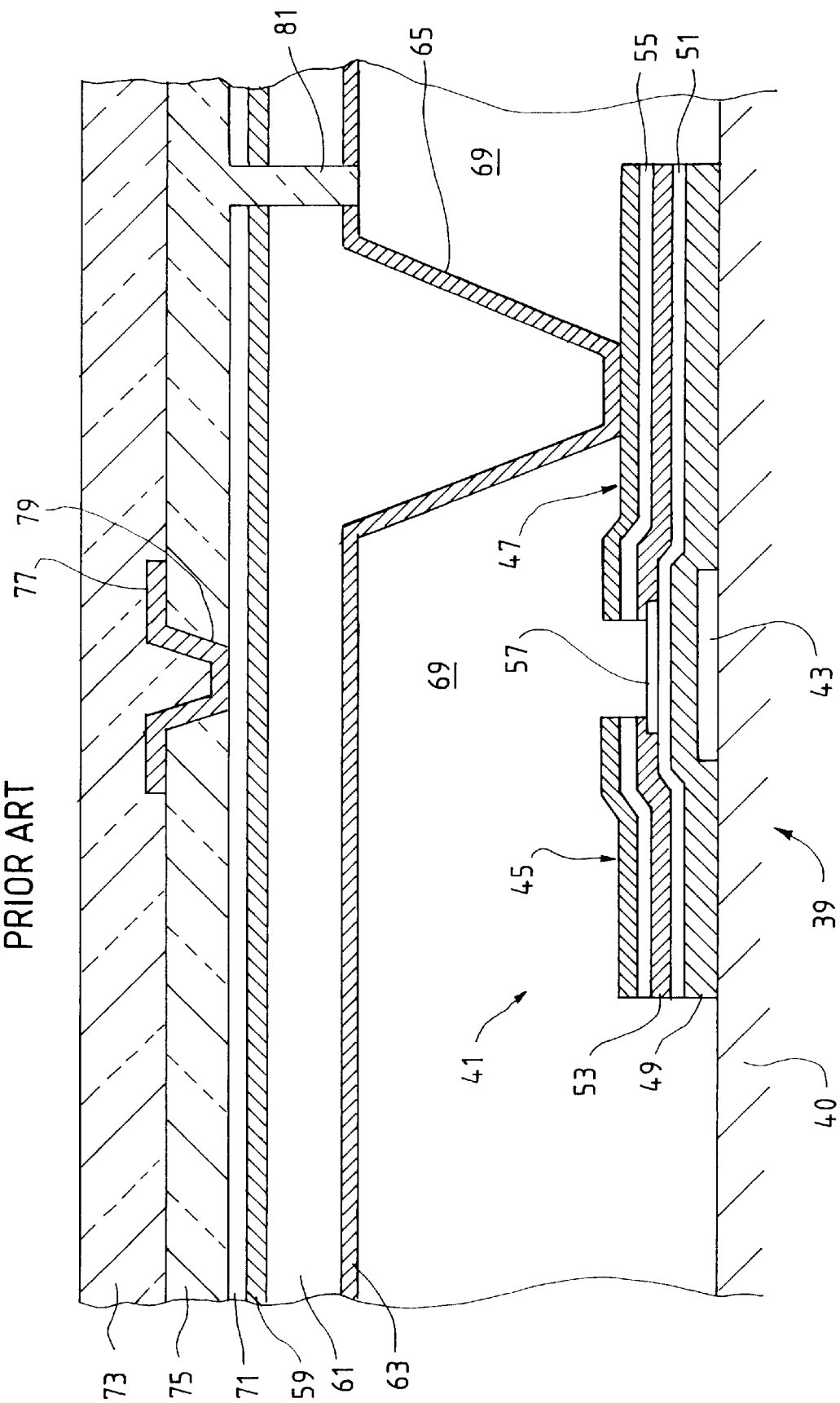
FIG. 3 is a side cross-sectional view of a prior art solid state imager wherein each pixel includes a photodiode operatively associated with a switching thin film transistor (TFT).

Referring now more particularly to the accompanying drawings in which like reference numerals indicate like parts throughout the several views.

Figure 4:
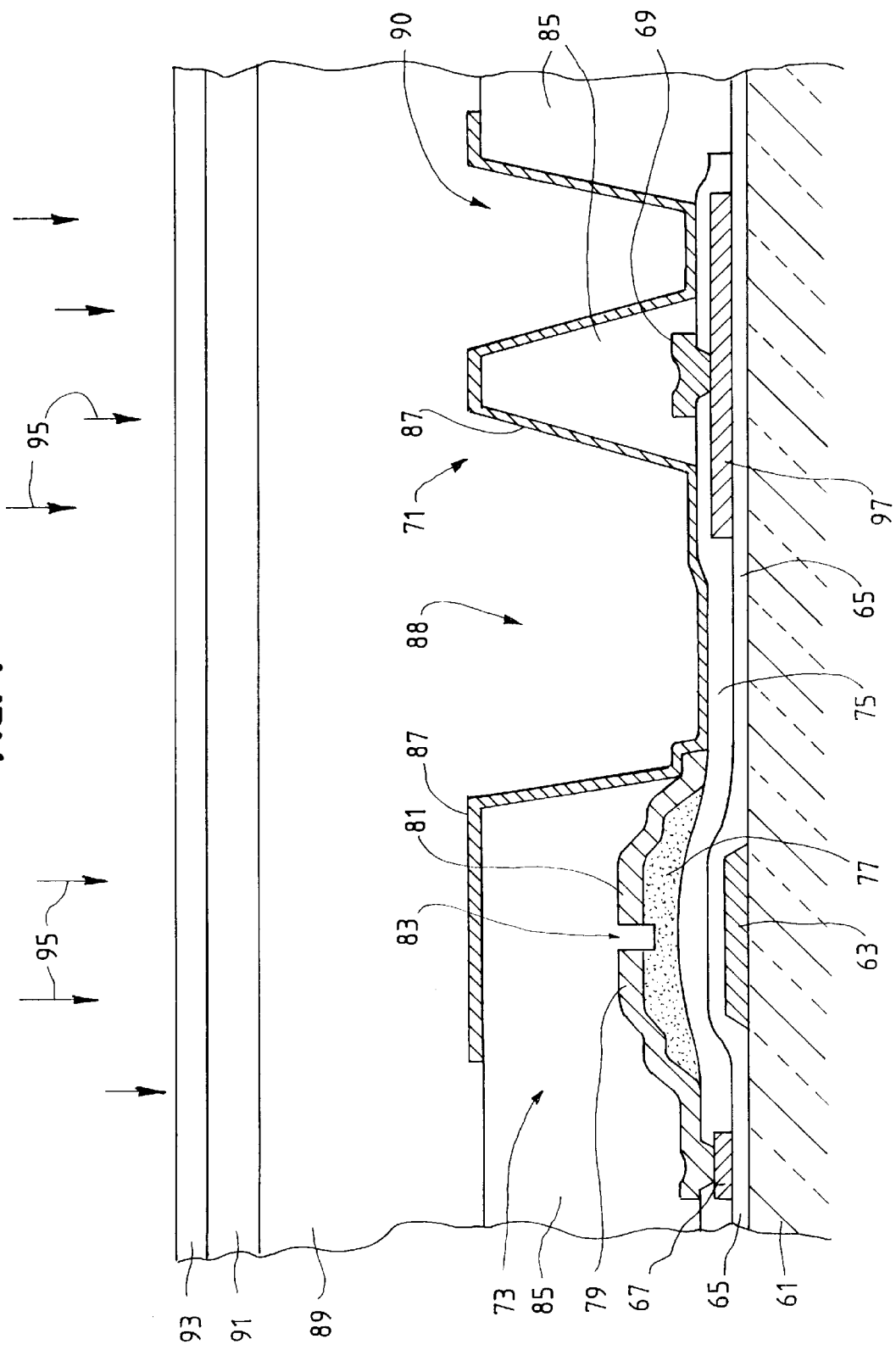
FIG. 4 is a side cross sectional view of a pixel of an x-ray imager in accordance with an embodiment of this invention, this embodiment including a switching TFT and a storage capacitor in each pixel.

FIG. 4 illustrates an imager (e.g. x-ray imager) according to an embodiment of this invention, wherein insulation or passivation layer 85 has a dielectric constant value of less than about 5.0 (preferably less than about 3.5, and most preferably less than about 3.0) in order to reduce parasitic capacitance in overlap areas and to thereby improve the signal-to-noise ratio of the imager. In certain preferred embodiments, passivation layer 85 is photo-imageable so as to reduce the number of steps needed to make the imager, although the passivation layer may be dry etchable in alternative embodiments.

For large area x-ray imagers, one of the main contributors to signal noise is the column capacitance. The noise gain for this component is: noise gain=(approximately) $1+(C_{col}/C_{fb})$ where $C_{fb}$ is the feedback capacitance of the charge amplifier in the readout electronics and $C_{col}$ is the column capacitance of the array. A large collector electrode and small pixel-column capacitance are best achieved simultaneously by overlapping the electrode with some or part of the buslines and TFT using a thick, low capacitance inter-level dielectric layer 85. The parasitic capacitance between the pixel and buslines is proportional to the dielectric constant of layer 85 divided by the thickness of layer 85.

Referring to FIG. 4, the imager includes substantially transparent substrate 61 upon which TFT gate electrode 63, gate insulating layer 65, drain address line 67, ground address line 69, storage capacitor 71, thin film transistor (TFT) 73, dielectric layer 75, semiconductor layer 77, TFT drain electrode 79, TFT source electrode 81, TFT channel 83, passivation or insulating layer 85 for improving the signal-to-noise ratio of the imager, collector electrode 87 of storage capacitor 71, photoconductive layer 89 (e.g. selenium), dielectric layer 91, conductive layer 93 of conductive material that is substantially transparent to x-ray radiation 95, and bottom electrode 97 of the storage capacitor. Each collector electrode 87 is in electrical communication with (preferably contacting) a corresponding TFT source electrode 81 through a via or contact hole 88 defined in insulation layer 85. An array of such imaging pixels is formed on substrate 61.

A first array of vias 88 and a second array of vias 90 are defined in layer 85. The first array of vias 88 in layer 85 enables collector electrodes 87 to contact corresponding TFT source electrodes 81 and also enables each collector electrode 87 to form part of the corresponding storage capacitor 71, while the second array of vias or contact holes 90 enables each electrode 87 to form another part of each storage capacitor 71. Thus, each capacitor 71 includes two separate $C_{st}$ portions. Preferably, each pixel has a storage capacitance (collection capacitance) of about 2.1 pF to match the readout electronics and to obtain acceptable voltage division in the three-capacitor stack formed by the storage capacitance, x-ray photoconductor (Se) capacitance, and capacitance of the insulator on the Se. In certain embodiments, the column capacitance may be about 36 pF for the imager (7 inch long interrupted column) and the column resistance about 6.2 kohms (7 inch long interrupted column). The TFT size in certain embodiments may be optimized for readout rates of 0.25 to 1 Hz. The channel width/length ratio consistent with this readout rate is 15 um/8 um and meets requirements of OFF impedance ($>3\times 10^{13}$ ohm at gate voltage of −6 v and source-drain voltage of 10 v) and ON impedance ($<1\times 10^7$ ohm at gate voltage of 16 v and source-drain voltage of 10 v). The TFT array is preferably more than 60% transparent to optically reset the Se x-ray photoconductor after each x-ray exposure. The reset operation is performed using a backlight (not shown) and removes trapped charge from the Se layer 89. The transparency requirements and large storage capacitance needs are simultaneously met by using substantially transparent conducting films of indium tin oxide (ITO) for both electrodes of storage capacitor 71.

Roughly speaking, an imager according to this invention may be made by depositing the gate metal and patterning same, depositing the first ITO layer and patterning same into the ground electrode 97. A gate insulator (e.g. nitride) may then be deposited, followed by the a-Si semiconductor layer and the a-Si.n+ layer. The a-Si layers are patterned into TFT islands and vias are patterned in the gate nitride. Subsequently, metal film is deposited and delineated into source, drain, data line, and ground line portions. The TFTs are then passivated with layer 85 (e.g. photo-imageable polymer) in which vias are patterned. Then ITO is deposited and patterned into the collector electrodes. In certain emboidments, the pixel collection electrodes are separated by about 10 μm from each other and each covers about 86% of the corresponding pixel area including the TFT. In accordance with this invention, a wide dynamic range larger imager was achieved and panels operated at x-ray exposure doses as low as 0.1 mRontgen can be achieved.

Optionally, switching diodes may be used instead of TFTs, and/or top gate TFTs may be used instead of the illustrated bottom gate TFTs.

In operation, during exposure to x-ray radiation 95 (or any other type of applicable radiation), image-wise modulated x-rays impinge upon the imager panel of FIG. 4. The x-rays generate excess electron hole pairs within photoconductive layer 89 and, in the presence of the electric field caused by the difference in voltage between top conducting layer 93 and bottom electrodes 97, holes migrate toward the interface between photoconductive layer 89 and charge blocking layers immediately adjacent and above collector electrodes 87. The amount of electron hole pairs generated throughout photoconductive layer 89 is dependent on the intensity of the modulated x-ray radiation 95 impinging upon the panel. When a positive operating voltage is applied to layer 93, barrier dielectric layer 91 prevents holes from being injected into photoconductive layer 89 from top conductive layer 93. After a predetermined time period, radiation 95 is stopped and the application of operating voltage on layer 93 is removed thereby capturing a radiographic image in the panel in the form of an image-wise modulated charge distribution in storage capacitors 71. Switching devices (e.g. diodes or TFTs 73) are sequentially addressed and made conductive by applying an appropriate voltage to the gate address lines (e.g. x-lines) of the switching devices. This causes the charges stored in the corresponding capacitors 71 to flow through the y-lines to the input of the charge detectors referenced above.

In order to increase the receiving area of the imager and to maximize signal, collector electrodes 87 of storage capacitors 71 are formed so as to overlap the TFT in each pixel and to at least partially overlap the x address lines and/or y address lines. In certain embodiments, each collector electrode 87 overlaps the entire source electrode 81 and the channel 83 of the corresponding TFT, and also partially overlaps the adjacent x and y address or bus lines. In certain embodiments, the collector electrode 87 in each pixel overlaps the entire corresponding TFT as shown in FIG. 4. In certain preferred embodiments, the solid state imager may be an x-ray imager and may include a 14×8.5 inch imaging array with 1536×2560 pixels.

The use of low dielectric constant [less than about 5.0, preferably less than about 3.5, and most preferably less than about 3.0] polymer interlevel dielectric layer 85 reduces parasitic capacitance between the collector electrodes 87 and the TFT and/or address line(s), thereby reducing noise. This also reduces parasitic capacitance between ground line 69 and the signal line, another significant contributor of noise. Preferably, insulation layer 85 is from about 1.0 to 4.0 µm thick on the substrate and most preferably is from about 1.0 to 3.0 µm thick. In the case of medical x-ray imaging, an increase in the signal-to-noise ratio (in accordance with this invention) allows the same information to be obtained at a lower dose to the patient, or more information at the same does.

In certain embodiments of this invention, organic insulating layer 85 is substantially transparent to all visible wavelengths of light. However, in alternative embodiments of this invention, insulating layer 85 may be substantially transparent only to select visible wavelengths of light. For example, layer 85 may be of a material colored so that layer 85 is substantially transparent to green light, but is substantially opaque to red and blue light. This allows the imager to be reset using only a single visible wavelength, or a single colored group of visible wavelengths.

In areas of lateral overlap between electrodes 87 and address or bus lines, a pixel-line (PL) capacitor is defined by an electrode 87 on one side and the overlapped address line or TFT on the other. The dielectric disposed between the electrodes of these PL capacitors is insulation layer 85 in accordance with this invention.

The parasitic capacitance CPL of certain of these capacitors is defined by the equation:

$$C_{PL} = \frac{\epsilon \cdot \epsilon_0 \cdot A}{d}$$

where "d" is the thickness of layer 85, $\epsilon$ is the dielectric constant of layer 85, $\epsilon_o$ is the constant $8.85 \times 10^{-14}$ F/cm (permitivity in vacuum), and "A" is the area of the PL capacitor in overlap areas. The fringing capacitance may also be taken into consideration in a known manner. According to certain embodiments, $C_{PL}$ is less than or equal to about 0.01 pF. When the pixel pitch is smaller, $C_{PL}$ should be scaled to a lower value as well because overlap areas are smaller.

Substantially transparent insulating layer 85 having a dielectric constant less than about 5.0 is deposited as a sheet on substrate 61 so as to cover TFTs 73 and address lines 67 and 69 (and the gate address lines 63). Layer 85 is formed of a photo-imageable material such as Fuji Clear™ or a photo-imageable type of BCB in certain embodiments. Insulating layer 85 is continuous in the viewing area of the imager except for vias or contact holes 88 and 90 formed therein to allow electrodes 87 to contact corresponding TFT source electrodes 81 and form parts of the storage capacitors 71.

In certain preferred embodiments, layer 85 has a dielectric constant of about 2.7 and is made of a photo-imageable type of Benzocyclobutene (BCB), an organic material available from Dow Chemical, for the purpose of reducing capacitive cross-talk (or capacitive coupling) between electrodes 87 and the address lines and TFTs in overlap areas. Layer 85 has a low dielectric constant and/or a relatively large thickness for the specific purpose of reducing $C_{PL}$ in overlap areas.

Alternatively, layer 85 may be of a photo-imageable material known as Fuji Clear™, which is an organic mixture including 2-Ethoxyethyl acetate (55–70%), methacrylate derivative copolymer (10–20%), and polyfunctional acrylate (10–20%). This is an acrylic.

Following the deposition of insulation layer 85 on substrate 61, vias 88 and 90 are formed in insulation layer 85 by way of photo-imaging. Layer 85 acts as a negative resist so that UV exposed areas remain on the substrate and areas of layer 85 unexposed to UV during photo-imaging are removed during developing. Following the forming of vias 88 and 90, substantially transparent conductive electrodes 87 (e.g. made of indium-tin-oxide or ITO) are formed over layer 85 so that the electrodes 87 contact the corresponding source metal layers 81 of corresponding TFTs through vias 88 as illustrated in FIG. 4 (one source electrode is contacted by a corresponding electrode 87 in each pixel). Auxiliary vias 90 are formed in layer 85 at the same time as vias 88 so that electrodes 87 can form second parts of storage capacitors 71. Peripheral lead areas and seal areas are also removed by photo-imaging.

Another advantage of layer 85 is that layer 89 disclinations induced at electrode 87 edges by the topography of TFTs, storage capacitors, and address lines are substantially eliminated by planarization (i.e. few, if any, hills and valleys are present in the top surface of layer 85).

In certain situations, after etching and processing, electrodes 87 may not overlap the address lines at all according to certain embodiments of this invention, although some overlap is preferred in order to enlarge the active area. When no overlap occurs, the parasitic capacitance $C_{PL}$ between the address lines and the adjacent electrode 87 is still minimized or reduced due to insulating layer 85.

Referring now to FIGS. 4, it will be described how the imager including the array of TFT structures and corresponding address lines is made according to an embodiment of this invention. Firstly, substantially transparent substrate 61 is provided. Then, an Al layer approximately 2 kÅ thick is deposited on the substrate and then etched in the form of the gate electrodes and address lines. A Ta gate metal layer or sheet (which results in gate electrodes 63) is deposited on the top surface of substrate 61 over the aluminum to a thickness of from about 1,000–5,000 Å, most preferably to a thickness of about 2,500 Å. The gate metal sheet is deposited by way of sputtering or vapor deposition. Insulating substrate 61 may be of glass, quartz, sapphire, or the like.

The structure including substrate 61 and the deposited Ta gate metal is then patterned by photolithography to the desired gate electrode and gate address line configuration. The upper surface of the gate metal is exposed in a window where the photoresist has not been retained.

The Ta gate metal is then dry etched (preferably using reactive ion etching) in order to pattern the gate metal in accordance with the retained photoresist pattern. To do this, the structure is mounted in a known reactive ion etching (RIE) apparatus which is then purged and evacuated in accordance with known RIE procedures and etchants. This etching of the gate metal is preferably carried out until the gate metal is removed in center areas of the windows and is then permitted to proceed for an additional time (e.g. 20 to 40 seconds) of overetching to ensure that the gate metal is entirely removed from within the windows. The result is gate address lines (and gate electrodes 63) being left on substrate 61. The Ta gate electrodes and address lines are Al anodized in certain embodiments with the Al then being etched.

After gate address lines and electrodes are deposited and patterned on top of substrate 61 in the above-described manner, gate insulating layer 65 is deposited over substantially the entire substrate 61 preferably by plasma enhanced chemical vapor deposition (CVD) or some other process known to produce a high integrity dielectric. Gate insulating layer 65 is preferably silicon nitride ($Si_3N_4$) but may also be silicon dioxide or other known dielectrics. Silicon Nitride has a dielectric constant of about 6.4 or higher. Gate insulating layer 65 is deposited to a thickness of from about 500–3,000 Å (preferably either about 1,000 Å) according to certain embodiments.

Then, bottom electrode ITO layer (which results in bottom storage capacitor electrodes 97 and address lines 67) is deposited over the $Si_3N_4$ gate insulator layer to a thickness of about 1200 Å, and thereafter etched to form the array of bottom electrodes 97 and at the same time the drain address lines 67 out of the same material. Then, another or second dielectric layer (which results in layer 75), preferably silicon nitride, is deposited over the bottom electrodes 97 and layer 65, to a thickness of about 2000 Å.

Next, semiconductor (e.g. intrinsic a-Si) layer 77 is deposited on top of the second dielectric layer to a thickness of about 2,000 Å. Semiconductor layer 77 may be from about 1,000 Å to 4,000 Å thick in certain embodiments of this invention. Then, a doped (typically phosphorous doped, that is n+) amorphous silicon contact layer is deposited over intrinsic a-Si layer 77 in a known manner to a thickness of, for example, about 500 Å. The doped contact layer may be from about 200 Å to 1,000 Å thick according to certain embodiments of this invention.

The second insulating or dielectric layer (which results in layer 75), semiconductor layer 77 and the doped semiconductor contact layer may all be deposited in the same deposition chamber without breaking the vacuum according to certain embodiments of this invention. When this is done, the plasma discharge in the deposition chamber is stopped after the completion of the deposition of a particular layer until the proper gas composition for deposition of the next layer (e.g. semiconductor layer) is established. Subsequently, the plasma discharge is re-established to deposit the next layer. Alternatively, the layers may be deposited in different chambers by any known method.

Following this formation, the TFT island or area may be formed by way of etching, for example, so that the TFT metal layers can be deposited thereon. For example, RIE may be used to etch the silicon semiconductor layers, and thereafter the total thickness of 3000 Å of silicon nitride (from both layers that result in 65 and 75) is exposed to RIE to form the illustrated contact vias therein and to pattern the dielectric 75. Thus, the contact vias in upper dielectric layer 75 are formed thereby allowing drain 79 to contact drain line 67 through one contact hole or via in each pixel and allowing ground line 69 to contact bottom storage capacitor electrode 97 through another contact hole in the same pixel (it is noted that neither the source, drain, or ground line metals have been deposited when the silicon nitride dielectric layer 75 is patterned/etched in preferred embodiments).

According to preferred embodiments, following the formation of the TFT island and the vias in dielectric layer 75, a source-drain metal sheet or layer of MoTa or the like (which results in drains 79, sources 81, and ground address lines 69) is deposited on substrate 61 over top of the semiconductor layer and dielectric layer 75. When MoTa, this metal layer is deposited to a thickness of from about 1,000–7,000 Å, preferably about 5,000 Å according to certain embodiments. The deposited source drain metal layer sheet is then patterned (masked and etched) to form the array of source electrodes 81, the array of drain electrodes 79, and the ground lines 69.

After patterning of drain and source portions, the a-Si n+ contact layer is etched in the channel 83 area and inevitably a bit of semiconductor layer 77 is etched along with it. The result is the channel shown in FIG. 4.

Substantially transparent polymer insulating layer 85 is then deposited onto substantially the entire substrate 61 by way of spin-coating according to certain is embodiments of this invention. Layer 85 may be of either photo-imageable BCB or Fuji Clear™ according to certain embodiments. Insulating layer 85 fills recesses generated upon formation of TFTs and flattens the surface above substrate 61 at least about 60–80% according to certain embodiments. This layer 85 is also deposited so that it covers the ground lines 69 and is located over the storage capacitor areas on the substrate. Layer 85 is deposited to a thickness of from about 1.0 to 4.0 $\mu$m, preferably about 1.8 $\mu$m.

Photo-imageable insulating layer 85 acts as a negative resist layer according to certain embodiments of this invention so that no additional photoresist is needed to form vias 88 and 90 in layer 85. In order to form the vias, layer 85 is irradiated by ultraviolet (UV) rays (e.g. i rays of 365 nm), with UV irradiated areas of layer 85 to remain and non-exposed or non-radiated areas of layer 85 to be removed in developing. A mask may be used. Thus, the areas of the negative resist 85 corresponding to vias 88 and 90 are not exposed to the UV radiation, while the rest of the layer 85 across the substrate is exposed to UV.

Following exposure of layer 85 (except in the via or contact hole areas), layer 85 is developed by using a known developing solution at a known concentration. In the developing stage, the areas of layer 85 corresponding to vias 88 and 90 are removed (i.e. dissolved) so as to form the vias in the insulating layer. After developing, the resist layer 85 is cured or subjected to postbaking (e.g. about 240 degrees C for about one hour) to eliminate the solvent so that the layer 85 with the vias therein is resinified. Thus, no dry or wet etching is needed to form the vias in layer 85. According to alternative embodiments, layer 85 may be a positive resist as opposed to a negative resist. According to still further alternative embodiments, layer 85 may be fomrmed of dry etchable BCB, having a dielectric constant less than about 3.0, preferably at about 2.7 to 2.8.

Vias or apertures 88 are formed in insulation layer 85 over top of (or adjacent) each source metal electrode 81 so as to permit collector electrodes 87 to electrically contact corresponding source electrodes through vias 88. Also, vias 90 permit electrodes 87 to also a second portion of the storage capacitors 71. Layer 85 remains across substantially the rest of the substrate or array except in certain edge areas where contacts must be made or glueing done. As shown in FIG. 4, storage capacitor 71 includes at least two separate portions due to the presence of the mountain or projection of material 85 at at least one location over electrode 97.

After vias 88 and 90 are formed in layer 85, a substantially transparent conducting layer (e.g. ITO) which results in electrodes 87 is deposited and patterned (photomasked and etched) on substrate 61 over top of layer 85. After patterning (e.g. mask and etching) of this substantially transparent conducting layer, collector electrodes 87 are left in each pixel as shown in FIGS. 4 and 6–7. As a result of vias 88 and 90 formed in layer 85, each electrode 87 contacts a TFT source electrode 81 and a storage capacitor dielectric 75 as shown in FIG. 4. The electrode layer for forming electrodes 87 is substantially transparent (when made of ITO or indium-tin-oxide) and is deposited to a thickness of from about 1,000 to 3,000 Å (preferably about 1,200 Å) according to certain embodiments of this invention. Other known materials may instead be used as the upper capacitor electrode layer.

In certain other or alternative preferred embodiments, the imager may be made by depositing the gate metal on substrate 61 and patterning same to form electrodes 63, and then depositing the ITO layer on the substrate and patterning the first ITO layer to form bottom electrodes 97. Then, a silicon nitride insulating layer may be deposited on the substrate over the gate electrodes 63 and bottom capacitor electrodes 97. Then, after the nitride layer is deposited, the a-Si intrinsic layer is deposited then the n+ doped a-Si layer. The a-Si layers are patterned to form TFT islands, and then the single nitride layer is patterned to form vias or apertures therein to that the ground line 69 can contact the bottom electrode 97 in each pixel. Then, a metal layer is deposited and patterned to form the gate and source electrodes as well as the drain lines and ground lines. The TFTs are then passivated with layer 85 which is then patterned as discussed above, and layers 89, 91, and 93 are formed as described above.

The address line/collector electrode capacitance (fF) is less than about 20 fF, preferably less than or equal to about 12 fF, and most preferably less than or equal to about 7.0 fF according to this invention due to the low dielectric constant of layer 85.

Still referring to FIG. 4, after collector electrodes 87 have been deposited and patterned over the insulating layer 85 and dielectric layer 75, substantially continuous photoconductor layer 89 (i.e. radiation conversion layer) is deposited over top of the arrays of TFTs 73 and storage capacitors 71 on substrate 61. After photoconductive layer 89 is deposited, dielectric layer 91 and top conducting layer 93 are respectively deposited onto the substrate over photoconductive layer 89. The result is the x-ray imager including an array of the pixels illustrated in FIG. 4.

FIGS. 6 and 7 illustrate a pixel similar to that of FIG. 4 from different perspectives. FIG. 6 illustrates the imager from above, while FIG. 7 is a cross-sectional view of the imager. It is noted that FIG. 7 illustrates the imager absent layers 89–93. It is noted that in accordance with the FIGS. 6–7 embodiment of the imager, an additional contact hole or via 92 is formed in insulating layer 85. Thus, three different vias 88, 90, and 92 are simultaneously photo-imaged in layer 85 for each pixel. Also in accordance with the FIGS. 6–7 embodiment, it is optional that drain address line 67 be formed along with the drain electrodes of the TFTs. Because of the two vias or apertures 90 and 92 in the storage capacitor area in the FIGS. 6–7 embodiment, two separate capacitor portions 102 and 104 are formed in each pixel, with layer 75 acting as the dielectric.

Figure 5:
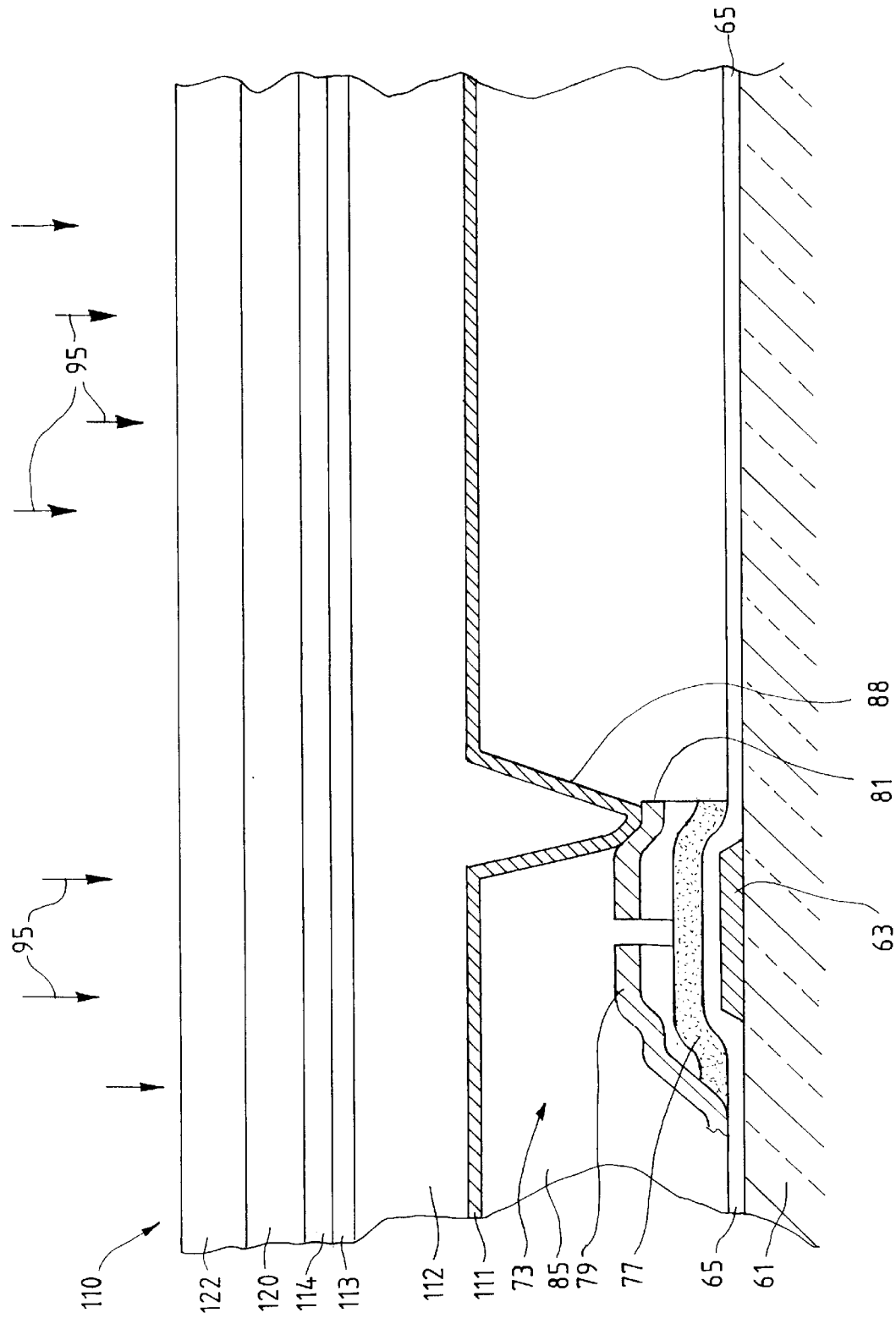
FIG. 5 is a side cross sectional view of a pixel of an x-ray imager in accordance with another embodiment of this invention, this embodiment including a switching TFT and a light sensing photodiode in each pixel.

FIG. 5 illustrates another embodiment of this invention, wherein a sensing photodiode 110 is utilized to detect incident radiation, instead of a storage capacitor. In accordance with the FIG. 5 embodiment, each TFT 73 in the array is formed in a similar manner on substrate 61 as described with regard to FIGS. 4 and 6–7. However, in each pixel, a PIN photodiode 110 is provided in order to detect incident radiation. PIN diode 110 includes n+ doped layer 111, intrinsic a-Si:H layer 112, and p+ doped layer 113. Layers 111–113 may be of amorphous silicon in certain embodiments. Photodiode 110 is biased by applying a voltage on a biased contact (not shown) which induces an electric field in layer 112. When light enters layer 112, electron hole pairs are generated. The electron and holes are swept by the electric field to opposite sides of the photodiode and accumulate near the photodiode electrode contacts which are conductive layer 114 and n+ doped layer 111. A conductive diode electrode may be provided adjacent each of layers 111 and 113 in certain embodiments. When TFT 73 is turned on, the accumulated charge is allowed to flow as current through the TFT to detecting components/circuitry. Because of via or contact hole 88 defined in insulating layer 85 in the FIG. 5 embodiment, the lower contact of PIN photodiode 110 is permitted to be in electrical communication with (preferably contact) the source electrode 81 of each TFT. This embodiment is advantageous relative to the prior art for the reasons set forth above in view of the low dielectric constant value of layer 85 and/or the photo-imageable nature of layer 85. Optionally, insulating layer 120 and passivation layer 122 may also be formed on the imager of the FIG. 5 embodiment.

Thus, in the FIG. 5 embodiment, the PIN photodiode in each imager pixel overlaps the switching device (e.g. TFT 73) as well as the row and/or column lines. The address lines and addressing scheme of U.S. Pat. Nos. 5,619,033 and 4,672,454 are incorporated hereby by reference. Thus, the active area may be increased to as much as 80% or more of the imager's total area, even for a pixel pitch as small as 50 μm. This higher active imaging area improves S/N ratio, which allows usable signal levels at extremely small pixel pitch, which, for example, opens up the mammography market to imagers. Low dielectric constant layer 85 is provided in the areas of overlaps to reduce parasitic capacitance.

Once given the above disclosure, many other features, modifications, and improvements will become apparent to the skilled artisan. Such other features, modifications, and improvements are, therefore, considered to be a part of this invention, the scope of which is to be determined by the following claims.

We claim:

1. A method of making an x-ray imaging device including an array of semiconductor switching elements, the method comprising the steps of:

a) providing a substrate;

b) forming an array of semiconductor based switching elements and corresponding address lines on the substrate, each switching element including a first capacitor electrode associated therewith:

c) covering said first capacitor electrodes with a dielectric layer;

d) depositing an organic photo-imageable insulating layer having a dielectric constant value of less than about 5.0 onto the substrate over the switching elements to a thickness of from about 1.0 to 4.0 μm;

e) photo-imaging the insulating layer in order to form a first group of vias or contact holes therein, each via in the first group corresponding to one of the switching elements;

f) forming an array of collector electrodes over the photo-imaged insulating layer so that each collector electrode communicates with one of the switching elements through a corresponding one of the vias in the insulating layer, each said collector electrode overlapping a portion of a corresponding first capacitor electrode within a corresponding one of the vias formed in the insulating layer, said first dielectric layer being disposed between the collector electrodes and the capacitor electrodes, thereby forming storage capacitors associated with said switching elements;

g) forming a photoconductive layer over the collector electrodes; and h) forming a conductive layer on the substrate in a location so that the photoconductive layer is located between the conductive layer and the collector electrodes, so that the storage capacitors are able to store charge as a function of incident radiation received by corresponding collector electrodes.

2. The method of claim 1, further comprising the step of forming bottom electrodes of the storage capacitors on the substrate so that each storage capacitor includes one of the bottom electrodes and one of the collector electrodes.

3. The method of claim 2, further comprising the step of forming the insulation layer so that the insulation layer both (i) is located between the bottom electrode and collector electrode in each storage capacitor area; and (ii) acts as an insulation layer at locations where collector electrodes overlap address lines and at locations where collector electrodes overlap portions of TFTs.

4. The method of claim 1, further comprising the steps of:
   in step e) irradiating or exposing the insulating layer with UV rays; and
   following said irradiating, developing the photo-imaged insulating layer so as to remove non-exposed areas of the insulating layer so as to form the vias.

5. The method of claim 4, further including the step of curing the insulating layer after said developing step.

6. The method of claim 1, wherein the insulating layer formed in step c) includes one of: (i) BCB; and (ii) an organic mixture including 2-Ethoxyethyl acetate.

7. The method of claim 1, wherein said steps are performed in the order they are recited.

* * * * *